United States Patent
Dabiri et al.

(10) Patent No.: US 8,234,550 B2
(45) Date of Patent: Jul. 31, 2012

(54) EFFICIENT DECODING

(75) Inventors: Dariush Dabiri, San Jose, CA (US); Nitin Barot, San Jose, CA (US)

(73) Assignee: PLX Technology, Inc., Sunnyvale, CA (US)

( * ) Notice: Subject to any disclaimer, the term of this patent is extended or adjusted under 35 U.S.C. 154(b) by 366 days.

(21) Appl. No.: 12/613,627

(22) Filed: Nov. 6, 2009

(65) Prior Publication Data

US 2010/0058143 A1 Mar. 4, 2010

Related U.S. Application Data

(60) Division of application No. 12/217,962, filed on Jul. 10, 2008, now Pat. No. 7,634,710, which is a continuation-in-part of application No. 11/090,109, filed on Mar. 25, 2005, now Pat. No. 7,461,328.

(51) Int. Cl.
H03M 13/00 (2006.01)
H03M 13/03 (2006.01)

(52) U.S. Cl. .......................... 714/780; 714/794; 714/795

(58) Field of Classification Search .................. 714/780, 714/794, 795
See application file for complete search history.

(56) References Cited

U.S. PATENT DOCUMENTS

| | | | |
|---|---|---|---|
| 4,295,218 A * | 10/1981 | Tanner | 714/762 |
| 4,879,456 A | 11/1989 | Cherry | |
| 5,426,653 A | 6/1995 | Hayes | |
| 6,161,209 A | 12/2000 | Moher | |
| 6,304,995 B1 | 10/2001 | Smith | |
| 6,539,367 B1 * | 3/2003 | Blanksby et al. | 706/14 |
| 6,654,927 B1 | 11/2003 | Sall | |
| 6,721,916 B2 | 4/2004 | Agazzi et al. | |
| 6,751,770 B2 | 6/2004 | Morelos-Zaragoza | |
| 6,948,109 B2 | 9/2005 | Coe | |
| 7,000,177 B1 | 2/2006 | Wu | |
| 7,089,479 B2 | 8/2006 | Matsumoto | |
| 7,120,856 B2 | 10/2006 | Zhang | |
| 7,190,681 B1 * | 3/2007 | Wu | 370/316 |

(Continued)

OTHER PUBLICATIONS

Engling Yeo et al., Interative Decoding Algorithms and their implementation, Project Report 2001-02 for Micro Project 01-061, Nov. 2002.

(Continued)

*Primary Examiner* — Joseph D Torres
(74) *Attorney, Agent, or Firm* — Brian R Short

(57) ABSTRACT

A decoder includes circuitry for generating bits representing received signals, and beliefs representing an associated reliability of each bit. A bit node computation block receives the bits and associated beliefs, and generates a plurality of bit node messages. A plurality of M serially-connected pipeline stages receive the bit node messages and after M decoding cycles, and generate a plurality of check node messages once per decoding cycle, wherein for each iteration cycle, each of the M serially-connected pipeline stages performs check node computations using all of J component codes, wherein each one of the M serially-connected pipeline stages performs check node computations once per decoding cycle using a single component code that is different that component codes used for all other of the M serially-connected pipeline stages, wherein J is at least as great as M, and wherein each iteration includes M decoding cycles.

17 Claims, 13 Drawing Sheets

U.S. PATENT DOCUMENTS

| | | | |
|---|---|---|---|
| 7,299,397 B2 * | 11/2007 | Yokokawa et al. | 714/752 |
| 7,318,186 B2 * | 1/2008 | Yokokawa et al. | 714/758 |
| 7,370,265 B2 * | 5/2008 | Shen et al. | 714/792 |
| 7,489,744 B2 * | 2/2009 | Sindhushayana et al. | 375/340 |
| 7,500,168 B2 * | 3/2009 | Yoshida | 714/752 |
| 2003/0037298 A1 | 2/2003 | Eleftheriou et al. | |

OTHER PUBLICATIONS

Xiao-Yu Hu el al., Efficient Implementations of the Sum-Product Algorithm for Decoding LDPC codes, 2001 IEEE.

International Search Report, PCT/US 06/10626, "Efficient Decoding", Dec. 21, 2007.

* cited by examiner

EFFICIENT DECODING

RELATED APPLICATIONS

This application is a divisional of patent application Ser. No. 12/217,962 filed on Jul. 10, 2008 which is a continuation-in-part (CIP) of patent application Ser. No. 11/090,109, filed Mar. 25, 2005 which issued as U.S. Pat. No. 7,461,328 on Dec. 2, 2008, and herein incorporated by reference.

FIELD OF THE INVENTION

The invention relates generally to network communications. More particularly, the invention relates to a method and apparatus for efficient decoding.

BACKGROUND OF THE INVENTION

High-speed networks are continually evolving. The evolution includes a continuing advancement in the operational speed of the networks. The network implementation of choice that has emerged is Ethernet networks physically connected over unshielded twisted pair wiring. Ethernet in its 10/100BASE-T form is one of the most prevalent high speed LANs (local area network) for providing connectivity between personal computers, workstations and servers.

High-speed LAN technologies include 100BASE-T (Fast Ethernet) and 1000BASE-T (Gigabit Ethernet). Fast Ethernet technology has provided a smooth evolution from 10 Megabits per second (Mbps) performance of 10BASE-T to the 100 Mbps performance of 100BASE-T. Gigabit Ethernet provides 1 Gigabit per second (Gbps) bandwidth with essentially the simplicity of Ethernet. There is a desire to increase operating performance of Ethernet to even greater data rates.

An implementation of high speed Ethernet networks includes simultaneous, full bandwidth transmission, in both directions (termed full duplex), within a selected frequency band. When configured to transmit in full duplex mode, Ethernet line cards are generally required to have transmitter and receiver sections of an Ethernet transceiver connected to each other in a parallel configuration to allow both the transmitter and receiver sections to be connected to the same twisted wiring pair for each of four pairs.

FIG. 1 shows several Ethernet twisted pair LAN connections 112, 114, 116, 118 in parallel. The first connection 112 is between a first transmitter 115a (S1A) and first receiver 125a (R1A), and a second transmitter 115b (S1B) and a second receiver 125b (R1B). The second connection 114 is between a third transmitter 135a (S2A) and third receiver 145a (R2A), and a fourth transmitter 135b (S2B) and a fourth receiver 145b (R2B). The third connection 116 is between a fifth transmitter 155a (S3A) and fifth receiver 165a (R3A), and a sixth transmitter 155b (S3B) and a sixth receiver 165b (R3B). The fourth connection 118 is between a seventh transmitter 175a (S4A) and seventh receiver 185a (R4A), and an eighth transmitter 175b (S4B) and an eighth receiver 185b (R4B). Hybrid circuits 130a, 140b, 132a, 142b, 134a, 144b, 136a, 146b are included between the transmitters and receivers.

The twisted pair LAN connections 112, 114, 116, 118 are located physically proximate, and interference between the twisted pairs 112, 114, 116, 118 is caused by interactions between signals of the twisted pair LAN connections 112, 114, 116, 118.

Information such as video, audio and data, is communicated over the networks as binary values. More specifically, the information is conveyed as zeros and ones. During transmission and processing of the information, errors can be unintentionally introduced. That is, a zero may be changed to a one, or vice versa. High speed networks, such as Gigabit Ethernet are more susceptible to these errors than slower speed networks because of the increased interference.

To provide a mechanism to check for errors and in some cases to correct errors, binary data can be coded to introduce carefully designed redundancy. Coding of a unit of data produces what is commonly referred to as a codeword. Because of its redundancy, a codeword often includes more bits that the input unit of data from which the codeword was produced.

When signals arising from transmitted codewords are received or processed, the redundant information included in the codeword as observed in the signal can be used to identify and/or correct errors in transmitted data.

A class of codes referred to as low density parity check (LDPC), has emerged for use in data transmission. LDPC codes are coding schemes that use iterative decoders. It has been shown that LDPC codes can provide very good error correction for large codewords.

Longer codewords are often more reliable at error detection and correction due to the coding interaction over a larger number of bits. The use of longer codewords can be beneficial by increasing the ability to detect and correct errors. However, a difficulty in adopting LDPC code that include long codewords is the complexity of implementing the code. LDPC coding using long codewords are significantly more complex than traditionally used coding systems such as convolution codes and Reed-Solomon codes. The added complexity requires additional power.

It is desirable to have an apparatus and method for coding and decoding high speed transmission data that is complex, but yet dissipates low power.

SUMMARY OF THE INVENTION

An embodiment includes a decoder. The decoder includes means for generating bits representing received signals, and beliefs representing an associated reliability of each bit. A bit node computation block receives the bits and associated beliefs, and generates a plurality of bit node messages. A plurality of M serially-connected pipeline stages receive the bit node messages and after M decoding cycles, and generate a plurality of check node messages once per decoding cycle, wherein for each iteration cycle, each of the M serially-connected pipeline stages performs check node computations using all of J component codes, wherein each one of the M serially-connected pipeline stages performs check node computations once per decoding cycle using a single component code that is different that component codes used for all other of the M serially-connected pipeline stages, wherein J is at least as great as M, and wherein each iteration includes M decoding cycles.

Other aspects and advantages of the present invention will become apparent from the following detailed description, taken in conjunction with the accompanying drawings, illustrating by way of example the principles of the invention.

DETAILED DESCRIPTION

Figure 1:
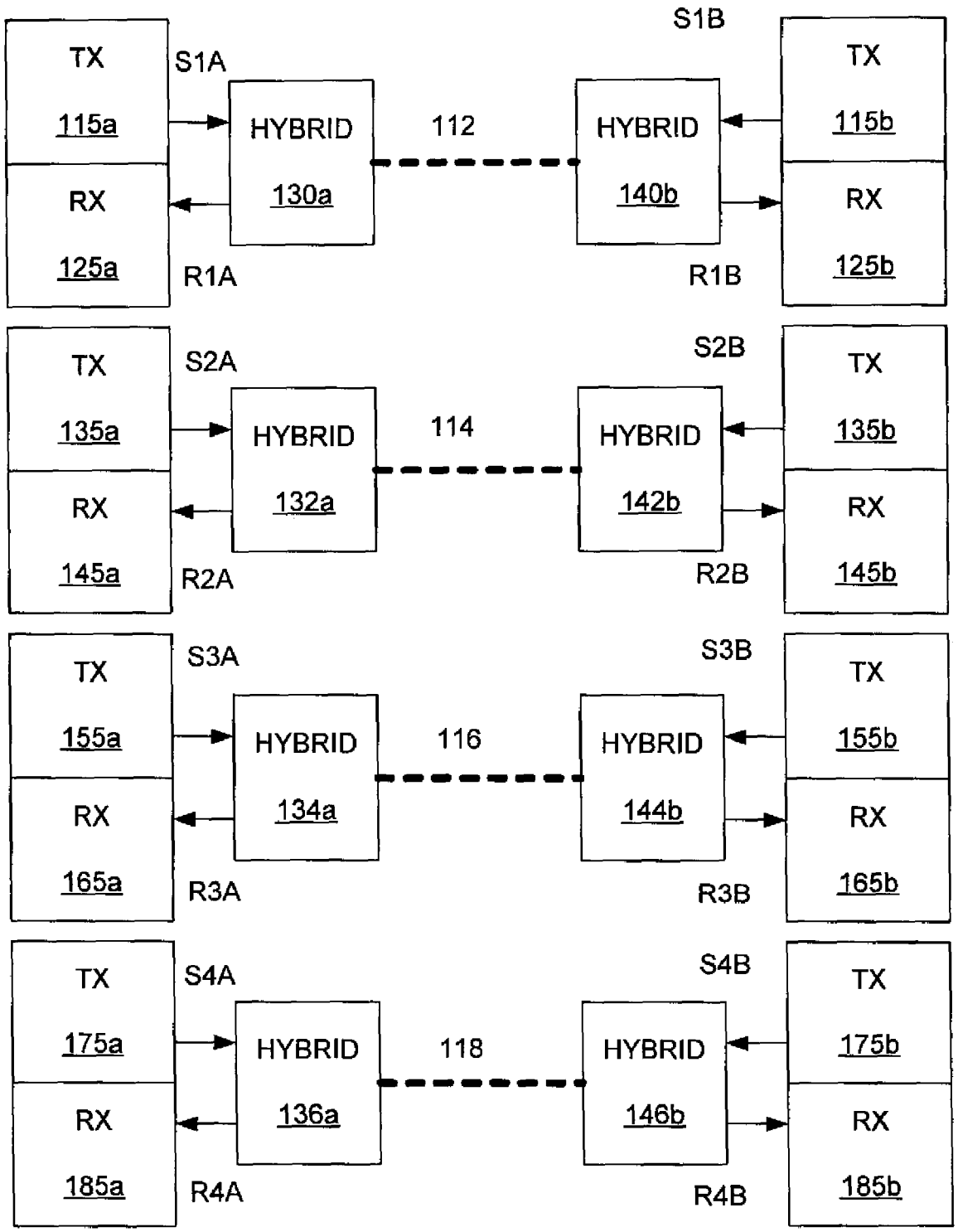
FIG. 1 shows a plurality of transceiver pairs located adjacently, and suffering from cross-talk coupling between signal streams of the transceiver pairs.

As shown in the drawings for purposes of illustration, the invention is embodied in an apparatus and method for high performance decoding of a bit stream. The decoding can be implemented for low-power dissipation, and/or low latency.

Decoding of a received bit stream can include multiplying blocks of the bit stream (code words) by a parity matrix. A resulting parity check vector can provide an estimation of the integrity of the received bit stream. An exemplary parity matrix can be given as:

$$\begin{bmatrix} 1 & 1 & 0 & 0 & 1 & 0 & 0 \\ 0 & 1 & 1 & 0 & 0 & 1 & 0 \\ 0 & 0 & 1 & 1 & 0 & 0 & 1 \end{bmatrix}$$

An exemplary codeword that includes 7 bits of the data stream can be given as:

$$\begin{bmatrix} x_1 \\ x_2 \\ x_3 \\ x_4 \\ x_5 \\ x_6 \\ x_7 \end{bmatrix}$$

A parity check vector is determined by multiplying the codeword with the parity check matrix. More specifically, the parity check vector can be give as:

$$\begin{bmatrix} 1 & 1 & 0 & 0 & 1 & 0 & 0 \\ 0 & 1 & 1 & 0 & 0 & 1 & 0 \\ 0 & 0 & 1 & 1 & 0 & 0 & 1 \end{bmatrix} \begin{bmatrix} x_1 \\ x_2 \\ x_3 \\ x_4 \\ x_5 \\ x_6 \\ x_7 \end{bmatrix} = \begin{bmatrix} 0 \\ 0 \\ 0 \end{bmatrix}$$

For this exemplary parity check vector, a first parity condition can be satisfied if $x_1+x_2+x_5=0$, a second parity condition can be satisfied if $x_2+x_3+x_6=0$, and a third parity condition can be satisfied if $x_3+x_4+x_7=0$. The parity condition provides an indication of the integrity of the bits of the codeword of the received bit stream. The parity matrix and parity check vector provided here are for illustration purposes only.

Figure 2:
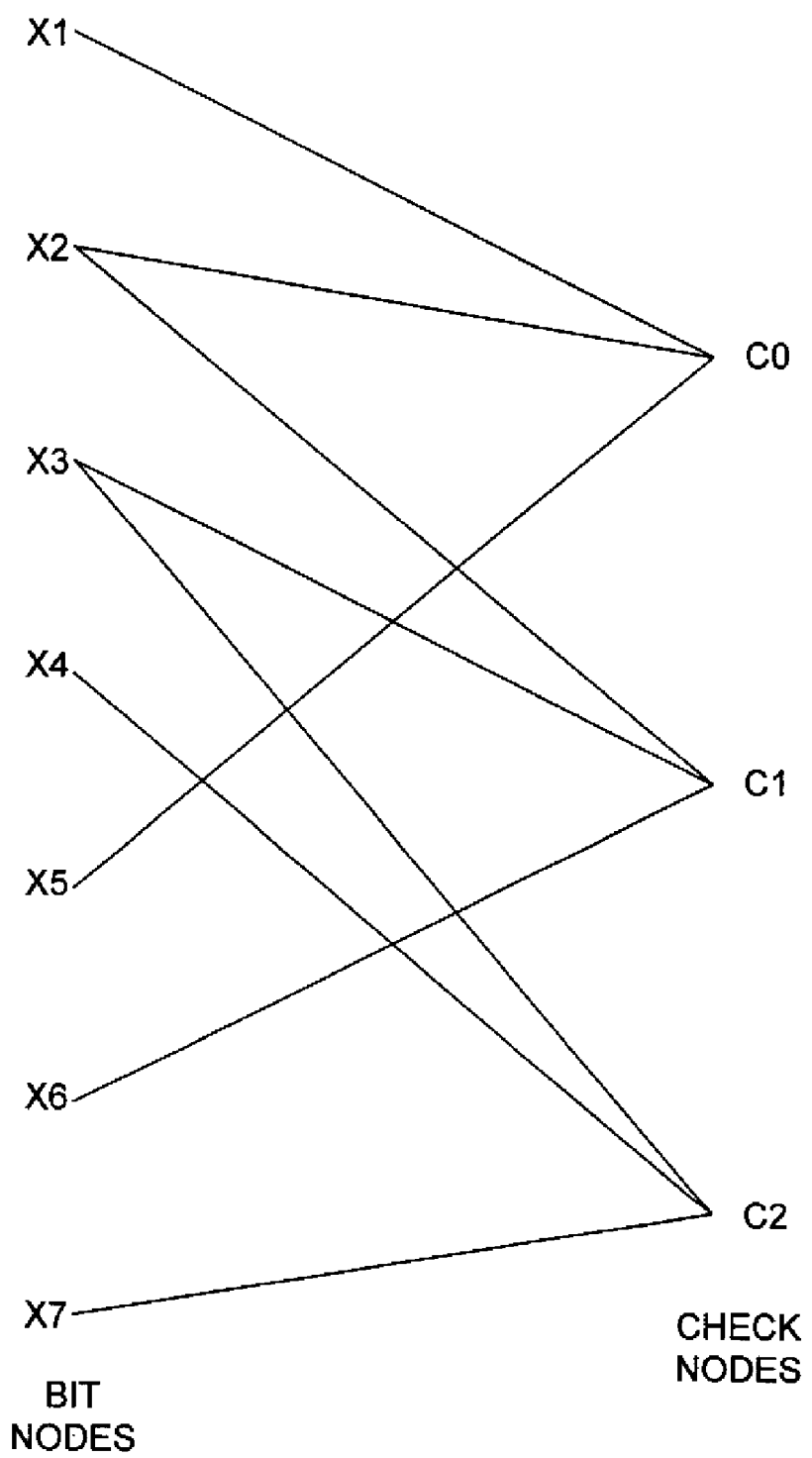
FIG. 2 shows a Tanner graph that depicts a relationship between check nodes and bit nodes.

FIG. 2 shows a Tanner graph that shows the relationship between bit nodes and check nodes of the above example. Variables C0, C1, C2 are check nodes, and represent the entries of the parity check vector. The bit nodes x1, x2, x3, x4, x5, x6, x7 are bit nodes, and represent the entries of the codeword. As shown, the check node C0 is dependent upon the bit nodes x1, x2, x5 the check node C1 is dependent upon the bit nodes x2, x3, x6 the check node C2 is dependent upon the bit nodes x3, x4, x7. the check nodes C0, C1, C2 correspond with the entries of the parity check vector. As will be described later, the values of the check nodes can be used to estimate the probabilities that the received bits x1, x2, x3, x4, x5, x6, x7 are correct.

Tanner graphs (like the one shown in FIG. 2) of LDPC codes generally include the property that no two distinct check nodes are connected to the same two distinct bit nodes. This is an important property of LDPC codes, and ensures that the codes don't have loops of a length of less than six. There are many possible implementations of iterative codes that satisfy this property. The implementations include a parity matrix that includes loops greater than six. A loop is a path on the Tanner graph that starts at one node and ends at the same node without repeating any edge, wherein an edge is a connection between a bit node and a check node.

Figure 3:
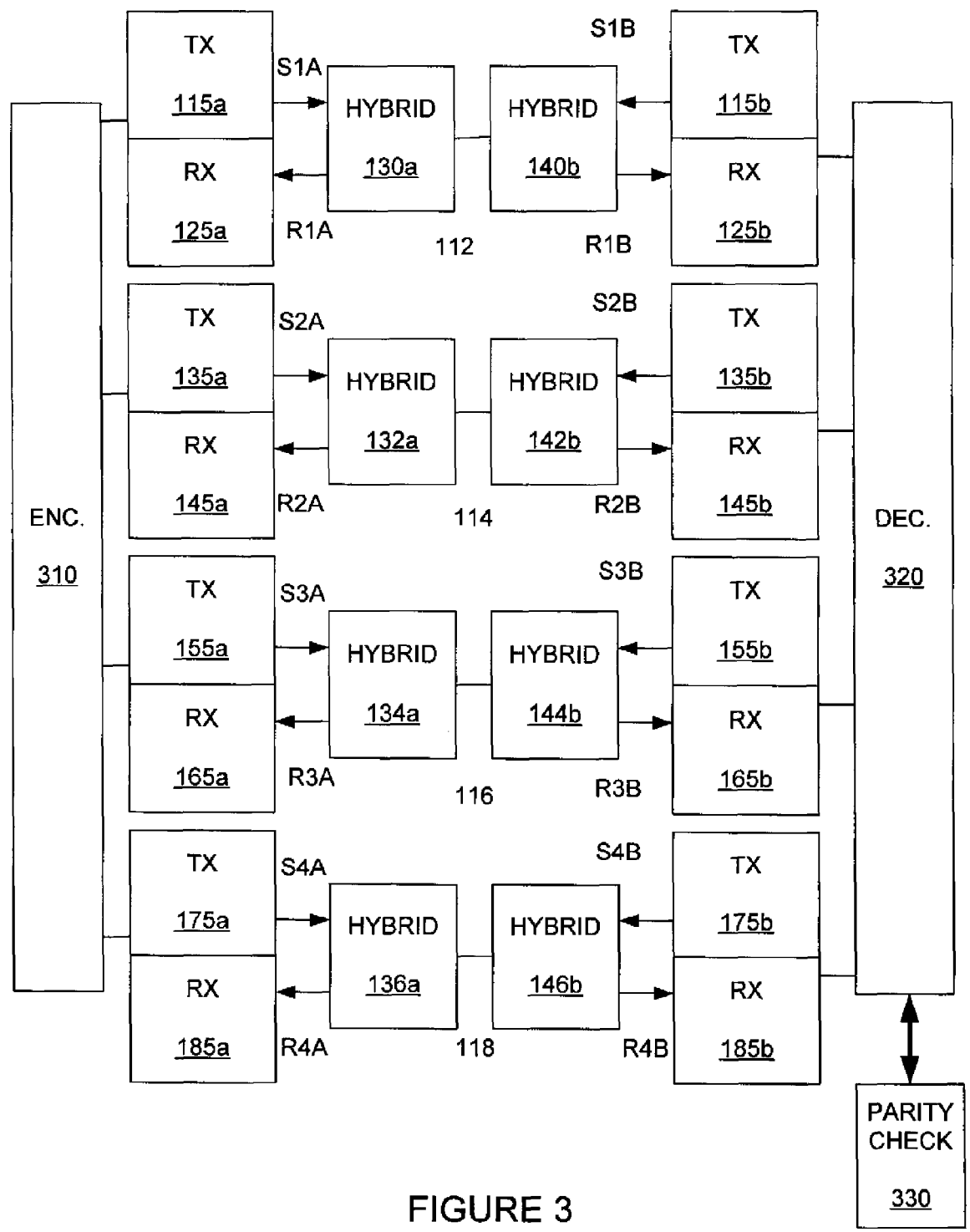
FIG. 3 shows a pair of transceivers that include an LDPC encoder and an LDPC decoder according to an embodiment of the invention.

FIG. 3 shows a pair of transceivers that include an LDPC encoder 310 and an LDPC decoder 320. Generally, LDPC decoding includes a sum product algorithm (SPA) for determining entries of a parity matrix (which can be included within a parity check 330). The complexity of the decoding is linearly dependent upon the column weight of the parity matrix, which is determined by the number of non-zero entries of each column. Improvements in performance of the decoding generally requires an increase in the column weight of the parity matrix, which typically increases the complexity, power dissipation, and/or the latency of the processing of the decoding.

Decoding Phases

The above-described SPA decoding includes two decoding phases per decoding iteration. The two phases include the bit node calculations and the check node calculations. The hardware dedicated to the bit node calculations is idle while the hardware that is dedicated to the check nodes is performing check node calculations, and the hardware that is dedicated to the check node calculations is idle while the hardware that is dedicated to the bit nodes is performing bit node calculations.

Therefore, hardware executing the decoding is not fully utilized, and therefore, less efficient than desired.

An iteration of decoding can be defined as including the bit node phase and the check node phase. The number of iterations for decoding received signals can be limited, or unlimited depending upon the decoding system. In practice, generally a cap is put on the maximum number of iterations. Early termination refers to a condition in which an iterative decoding algorithm is stopped before a maximum number of iterations have been executed. To achieve a desired bit error rate, a minimum number of iterations must be allocated to the decoding.

Rate of Decoding

SPA decoding is rate limited by the number of iterations, and the time required to execute each phase of decoding. More specifically, the rate of decoding can be estimated as 1/(2iT) where i is the number of iterations, and T is the time required for each decoding phase of the SPA decoding. The maximum number of iterations can be dependent upon several different constraints, but for the descriptive purposes, it is assume to be fixed. With present decoding implementations, the rate is limited by the estimate (bounds) as just described.

A Standard SPA Decoder

A code can be viewed as a bipartite graph, such as the previously described Tanner Graph. The graph includes two types of nodes. Bit nodes correspond with each bit of a codeword. Check nodes correspond to each row of a parity check matrix. Associated with each bit node is a number that reflects the reliability by the decoder on a value of the bit. For a bit b, the number is referred to as Belief(b). For example, if Belief (b)$-\infty$ then b is certainly "1". If Belief(b)=$\infty$, then b is certaintly "0". If Belief(b)=0, then b is equally likely to be either a "0" and a "1".

The SPA messages are passed between the check nodes and the bit nodes. Each message includes a real number. At any iteration of the decoding, these messages are used to update the belief values for the bit nodes. Each iteration of the decoding process can be divided into two phases. More specifically, the decoding process includes the bit node computations and the check node computations.

Bit Node Computation

Given the messages from each check node to bit node, each message from each bit node to connected check nodes is computed. Next, Belief values for each bit node are updated. That is:

Belief(b)=$\Sigma$ Messages (c$\rightarrow$b)+Channel Reliability Information, wherein c is a connected check node, and Messages (b$\rightarrow$c)=Belief(b)−Message(c$\rightarrow$b).

In the first iteration these messages are all zero.

Check Node Computation

For each embodiment, the check node computation is based on a Gallagher function ($\phi$). The Gallagher function is a well know function in decoding. More specifically, Message(c$\rightarrow$b$_0$)=$\Phi^{-1}$($\Sigma\Phi$(Message (b$_k$ to c))), where k$\neq$0.

Disadvantages of SPA

A fundamental disadvantage of SPA is a requirement of knowledge of all Messages (b$_k$$\rightarrow$c) in order to compute the Messages (c$_i$$\rightarrow$b$_k$), and all messages (c$_i$$\rightarrow$b$_k$) are required to compute messages (b$_k$$\rightarrow$c$_i$). The bit node computations need results from all check node computations. This requires the check node computation circuitry to be idle while waiting for the bit node computations, and the bit node computation circuitry to be idle while waiting for the check nodded computations.

Advantages of Described Embodiments over SPA

The described embodiments provide advantages over SPA. More specifically, the bit nodes and the check nodes of the described embodiments are updated simultaneously, and do not require check node circuitry to be idle while waiting for all bit node or check node computations. At every stage of a pipeline decoder, only the set of check nodes in the component code processed by that stage are updated.

Figure 4:
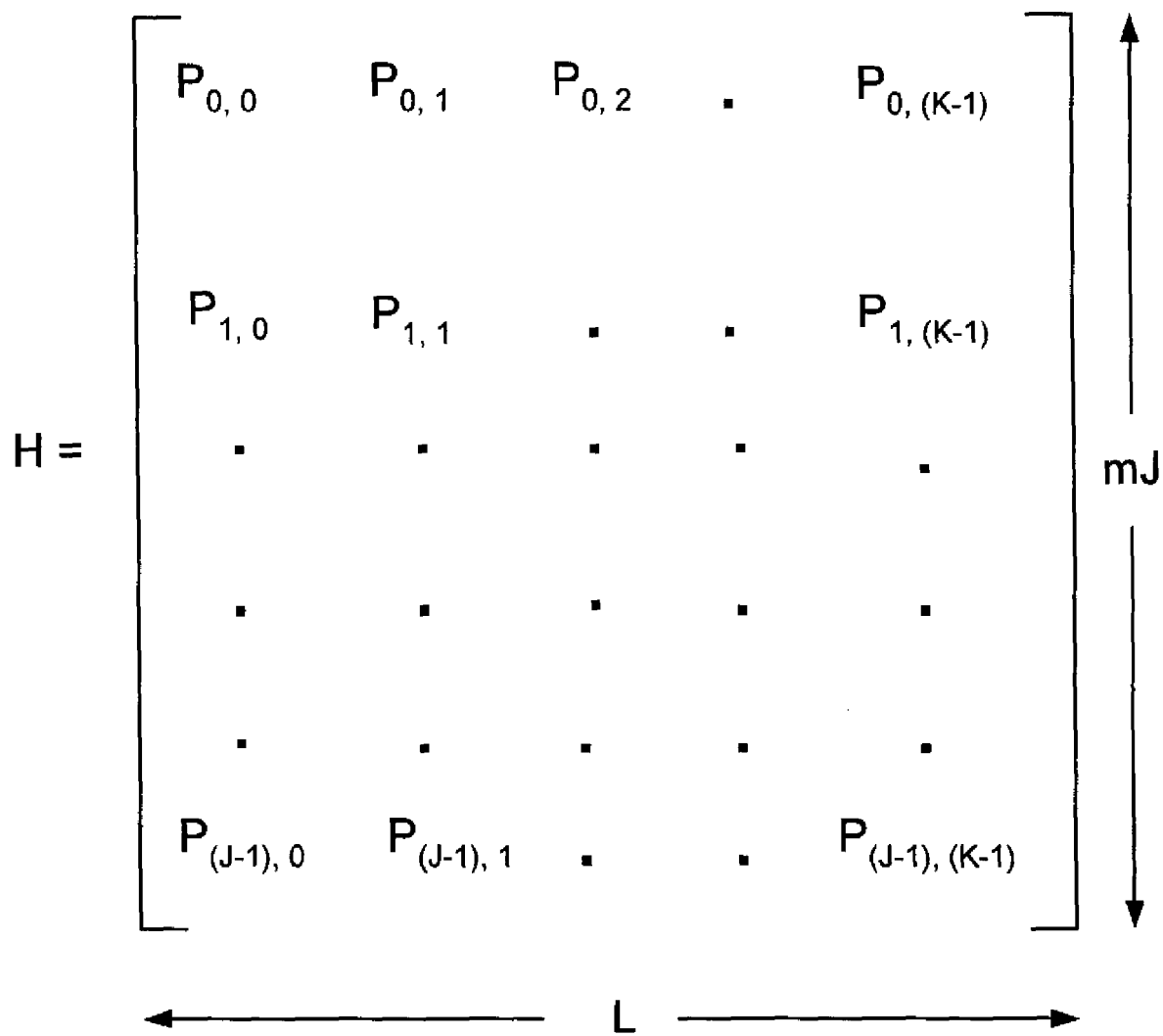
FIG. 4 shows an example of a parity check matrix.

FIG. 4 shows an example of a parity check matrix H. As shown, the parity check matrix includes permutation matrices $P_{ij}$, where each permutation matrix $P_{ij}$ has the dimensions of m×m, and the parity check matrix has dimensions of mJ×L (L=K×m). For an embodiment, the permutation matrix includes elements of "1" and "0", and has only one "1" within each row and column.

A Pipeline Decoder

Figure 5:
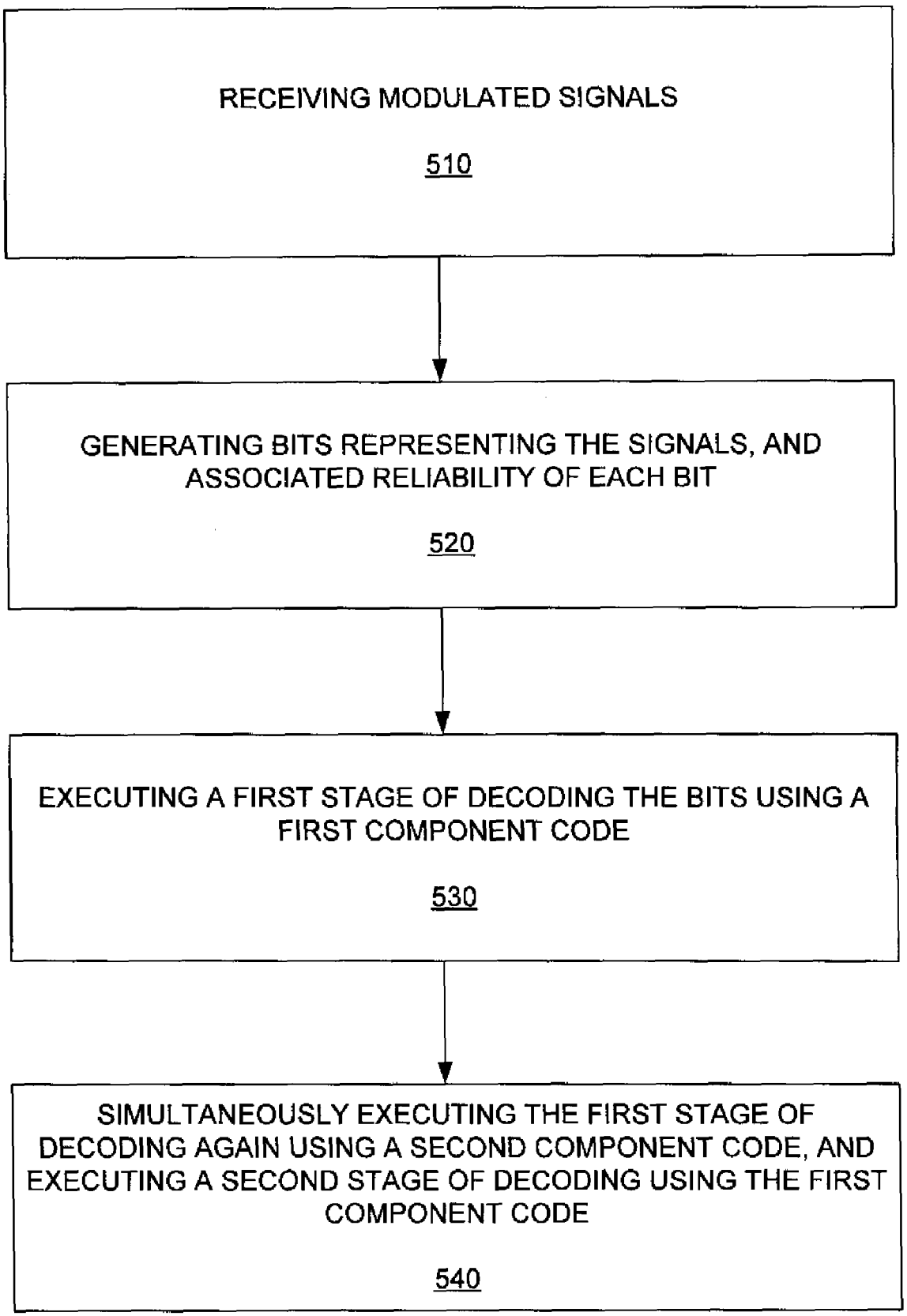
FIG. 5 is a flow chart showing steps included within a pipeline decoder that includes multiple component codes.

FIG. 5 is a flow chart that shows step included within a pipeline decoder that includes multiple component codes. As will be described, embodiments of this decoding provides for an increased number of decoding stages, while maintaining latency time. A first step 510 includes receiving modulated signals. A second step 520 includes generating bits representing the signals, and associated reliability of each bit. A third step 530 includes executing a first stage of decoding the bits using a first component code. A fourth step 540 includes simultaneously executing the first stage of decoding again using a second component code, and executing a second stage of decoding using the first component code. The first and second stages of decoding are used to generate the bit stream. The reception of the modulated signals of the first step 510 can be implemented by electronic circuitry that is either is located in a separate integrated circuit or located in a common integrated circuit as the decoding circuitry of the second, third or fourth steps 520, 530, 540.

Figure 6:
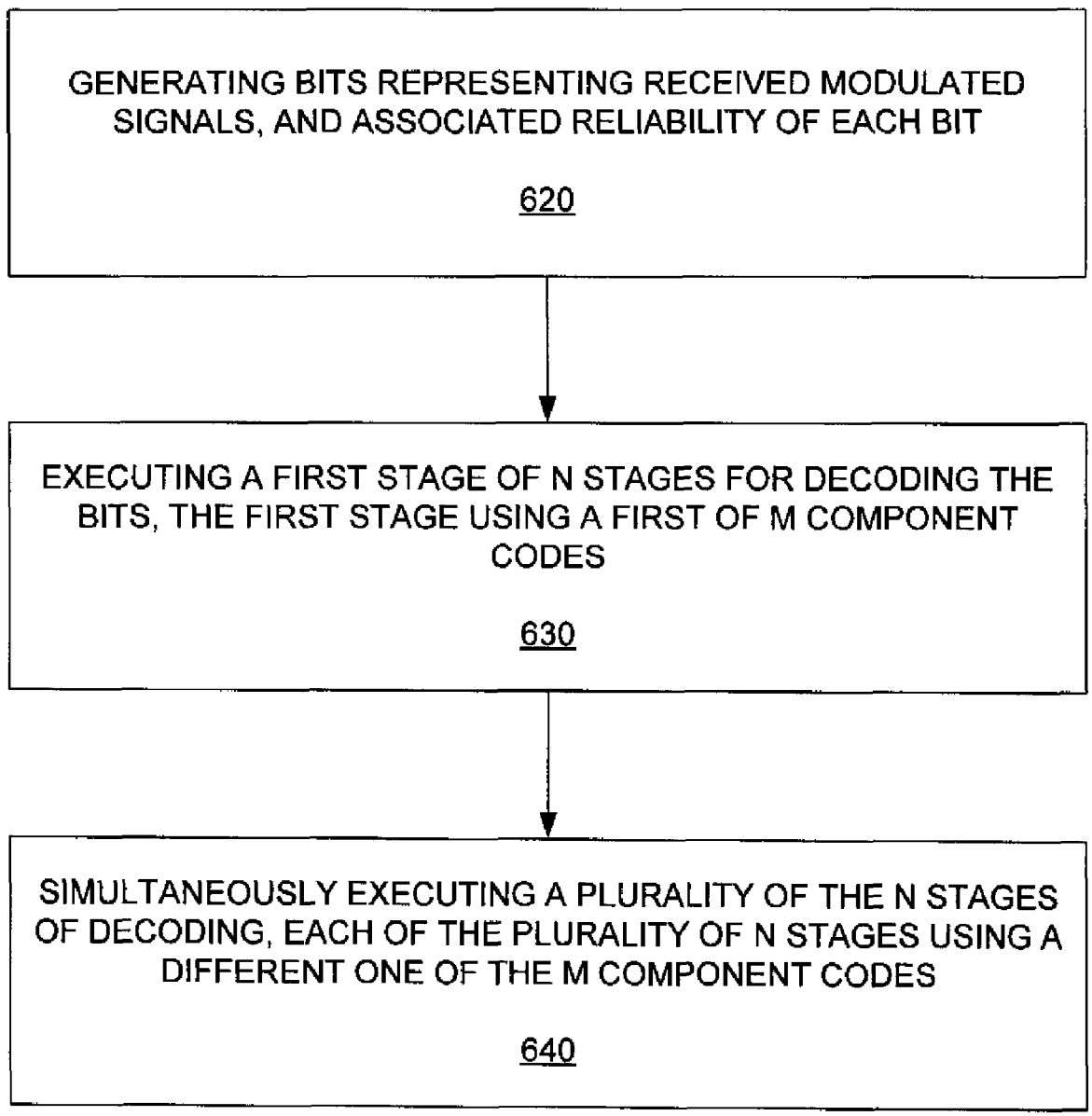
FIG. 6 is a flow chart showing steps included within a general pipeline decoder that includes M component codes and N stages.

FIG. 6 is a flow chart showing steps included within a general pipeline decoder that includes M component codes and N stages. The number of component codes M will always be greater than the number of stages N. A first step 620 includes generating bits representing received modulated signals, and associated reliability of each bit. A second step 630 includes executing a first stage of N stages for decoding the bits, the first stage using a first of M component codes. A third step 640 includes simultaneously executing a plurality of the N stages of decoding, each of the plurality of N stages using a different one of the M component codes. The plurality of N stages of decoding are used to generate the bit stream.

Component Codes

The decoding of FIGS. 5, 6 include component codes. Component codes are codes that are defined by a proper subset of parity check conditions (that is, a subset of a parity check matrix) of an original code. A component code can include row of the previously described parity matrix. For example, the previously described parity matrix includes three rows. An exemplary first component code can include the first two rows, and an exemplary second component code can include the third row. Generally, the component codes can each include any number of rows of the corresponding parity check matrix.

Component Code Selection

Each set of check nodes defines a corresponding component code. Various conditions and parameters can be used to select the component codes. As previously described, each of the component codes can be a subset of rows of the parity matrix.

Component code selections can be made so that characteristics of the parity check matrix of the component codes are maintained. For example, the component codes can be selected so that column weights of a parity check matrix of the component codes are non-zero. This can be an advantageous selection because this selection avoids error patterns affecting bits corresponding to zero weight columns of the parity check matrix, from slowing down convergence of the decoding algorithm or process. Zero weight parity check matrix columns can cause bits being decoded to become stuck on incorrect values.

The component codes can be selected so that each component code comprises a regular LDPC, and column weights of a parity matrix of the component codes are a pre-selected value. Making the column weights of all component codes of a common pre-selected value generally results in simpler hardware configurations required to implement the decoding. Note that a regular LDPC is an LDPC in which the column weights of the parity check matrix are all the same. Another embodiment includes column weights of a parity matrix of the component codes having pre-selected values that are not all the same. Generally, however, this embodiment leads to less efficient hardware implementations. When the pre-selected values are the same, the hardware implementing the decoding is typically more structured. That is, the hardware of each stage is more repetitive, and therefore, easier to implement.

The component codes can be selected so that a parity check matrix of the component codes has column weights of one. This configuration generally provides the maximum number of component codes and the maximum number of stages. This configuration is most ideal for maximum clock rates, and therefore, greater throughput than other decoding configurations.

Mathematical Representations

Decoding of the codes is highly dependent on the block permutation structure of the parity matrix of the codes. The following is a mathematical formulation of the decoding, having notation defined as follows.

The parity check matrix of FIG. 4 includes K blocks of columns along each row. The ith block of columns can be given as:

$$\begin{bmatrix} P_{0,i} \\ \vdots \\ \vdots \\ \vdots \\ \vdots \\ \vdots \\ P_{J-1,i} \end{bmatrix}$$

Defining $B_i$ to be the set of beliefs of the bit nodes defined by the ith block of columns of the parity check matrix. The order of entries of $B_i$ is the same as the order of columns in the ith block of the parity check matrix. Similarly, each block of rows of the parity check matrix of FIG. 4 can be viewed as a parity check matrix of a component code. In this case there are J component codes. The parity check matrix of the component code c is $[P_{c,o}\ P_{c,1}\ \ldots\ P_{c,(k-1)}]$.

The vector $(X_i)^c$ is defined such that its jth component is the message of the jth check node of the component code indexed by c, to a unique bit node in the ith block of the bit nodes. Note that the ordering of the elements of $(X_i)^c$ only depends on the ordering of the check nodes within each component code (indexed by c).

The vector $V_i^c$ is defined such that its jth component is the unique message arrived at the jth check node of the component code indexed by c.

The mapping $\Phi R \to R$, that defines the so-called Gallager function in the standard SPA. This mapping is generalized in a component-by-component manner to vectors in higher dimensions.

The main structural property that is invoked here includes observing that the message $(X_i)^c[j]$ is sent from the jth check node of the component code indexed by c, to the $\pi_i^c[j]$-th node of the ith block of bit nodes. Here, $\pi_i^c$ is the corresponding permutation map defined by the $P_{c,i}$ block of the parity check matrix.

From the above observation it follows that the bit node messages can be obtained by:

$$V_i^c = P_{c,i}[B_i - P^{-1}_{c,i}(X_i)^c] = P_{c,i}B_i - (X_i)^c.$$

The check node messages follows from the following equation:

$$(X_i)^c = \Phi^{-1}(\Sigma_{j \ne i} \Phi(V_i^c))$$

Finally the updated rules for beliefs are:

$$B_i = B_i - P^{-1}_{c,i}((X_i)^c) - (X_i)^c$$

Pipeline Decoding

Figure 7:
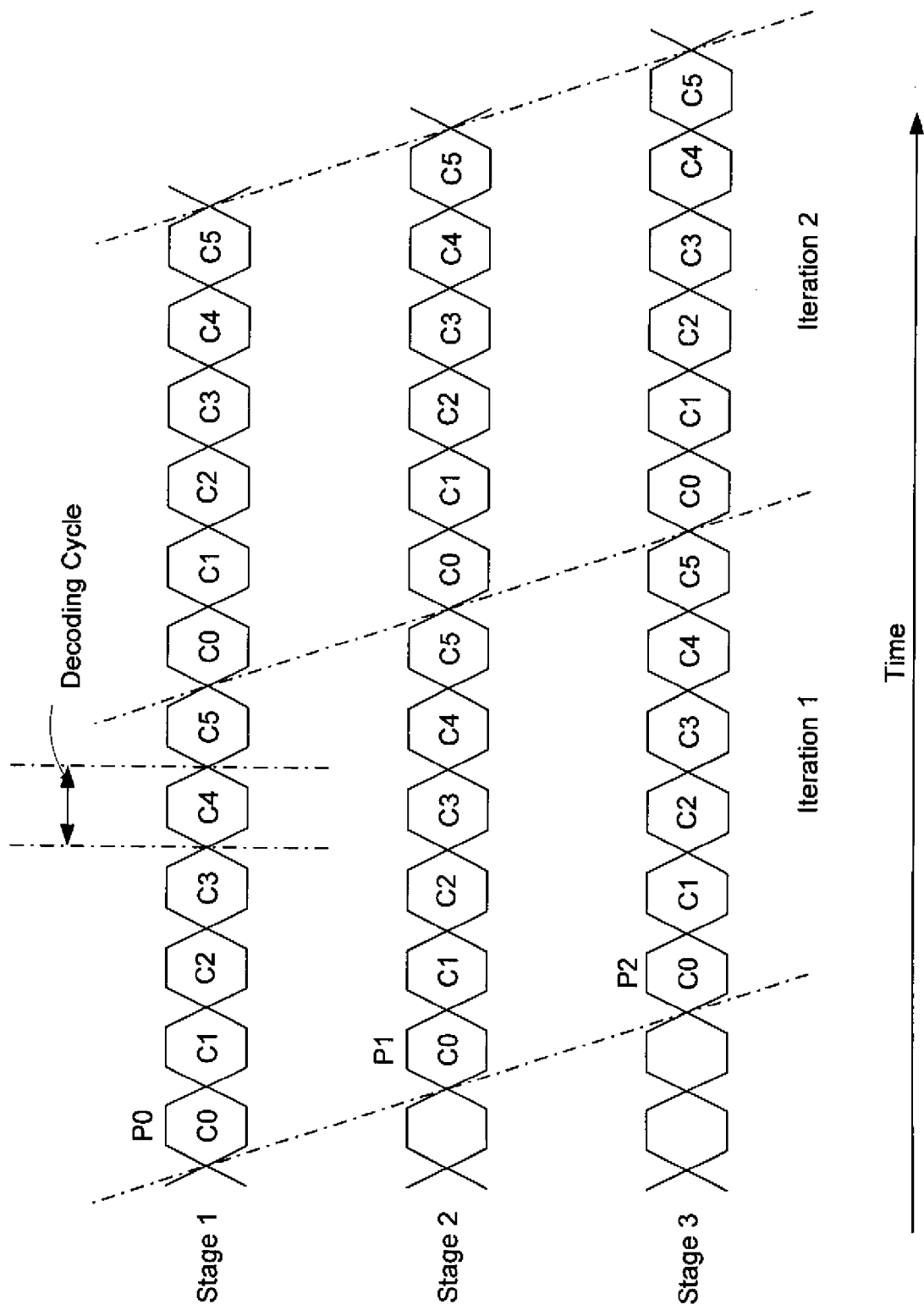
FIG. 7 shows time lines of several stages of pipelined decoding that includes multiple component codes.

FIG. 7 shows time lines of several stages of pipelined decoding that includes multiple component codes. As shown, iterations (FIG. 7 depicts two iterations) of the decoding can include each of the available stages executing all of the possible component codes. This embodiment includes six component codes C0, C1, C2, C3, C4, C5. As shown, each stage operates using a different component code for each decoding cycle. However, any number of component codes can be used for the pipeline decoding. Each stage of the decoding executes a decoding phase. Three phases P0, P1, P2 are shown in FIG. 7. The embodiment of FIG. 7 includes three stages corresponding to three decoding phases. The number of stages and corresponding decoding phases can be selected depending upon the required throughput, decoding complexity, clock rate, and characteristic of integrated circuit technology. A decoder utilizing a fast clock when the decoder is implemented with a slow speed integrated circuit technology, typically requires more pipeline stages. The number of component codes is greater than or equal to the number of pipeline stages.

Figure 8:
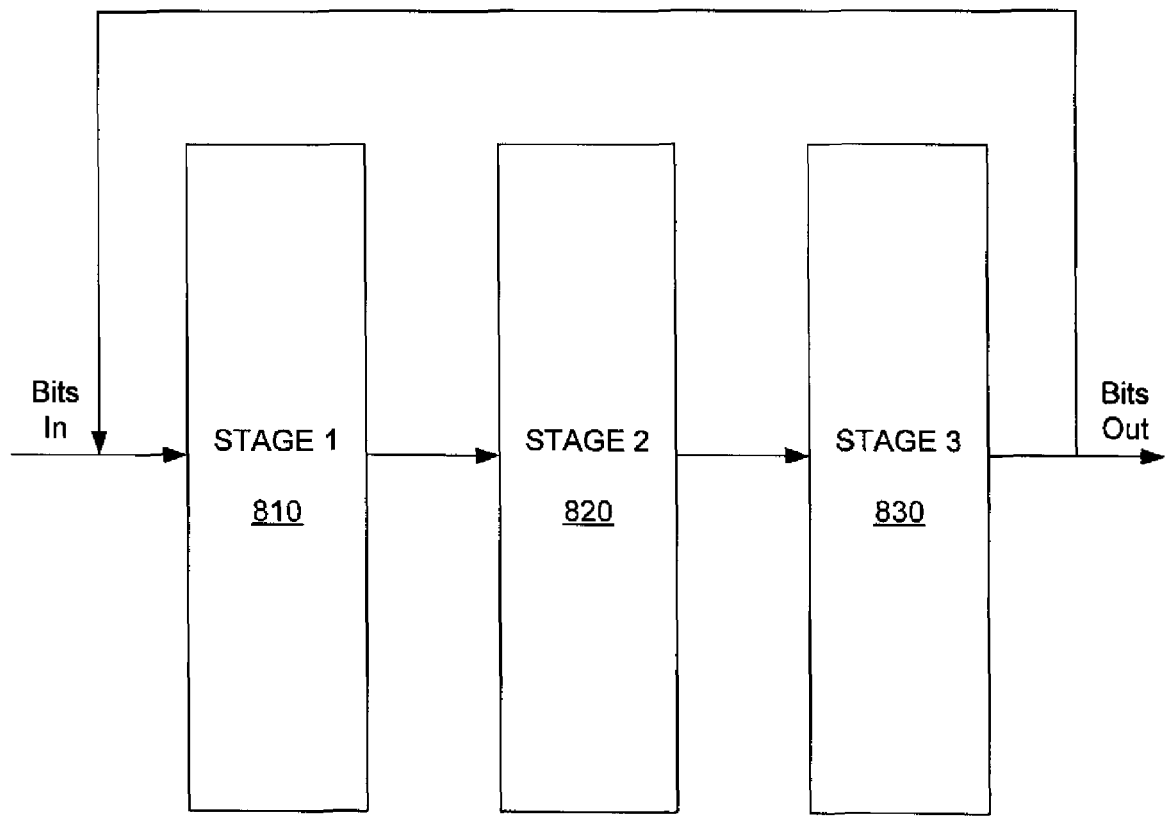
FIG. 8 shows a block diagram of an example of an embodiment of a pipeline decoder.

FIG. 8 is a block diagram of a pipeline decoder. This exemplary pipeline decoder includes three stages 810, 820, 830. The pipeline decoder receives bits (Bits In) for decoding and the associated reliability of the bits. The pipeline decoder generates decoded bits and associated reliability (Bits Out). The hardware of each stage maps the predetermined component codes into the hardware. During decoding, essentially all of the stages 810, 820, 830 are simultaneously operating, each operating on different one of the component codes. As previously stated, the number of component codes must be at least as great as the number of stages to prevent any one stage from "starving".

FIG. 7 is useful in understanding the operation of the pipeline decoder of FIG. 8. Each stage 810, 820, 830 is simultaneously operating on a different one of the component codes. An output of bits and associated reliability is generated after an iteration of decoding. Each iteration includes all stages executing all of the component codes. FIG. 7 shows an exemplary time of the operations of each of the stages 810, 820, 830.

The decoding embodiments of FIGS. 5, 6, 7, 8 are more efficient than typical SPA decoders because multiple decoding phases are being executed simultaneously. Therefore, the hardware dedicated to each of the decoding phase sits idle for a minimal amount of time.

Latency

The pipeline decoding structure of FIGS. 7, 8 provides a minimal amount of latency for a given integrated circuit technology without degrading the throughput of the decoder. An alternate decoding approach that provides the same throughput for the same integrate circuit technology includes allowing the decoder to process multiple codeword simultaneously. However, this decoding results in higher latency because it takes longer for a given codeword to be processed by the decoding because two or more codewords share the same decoding hardware.

Other Pipeline Decoding Embodiments

Figure 9:
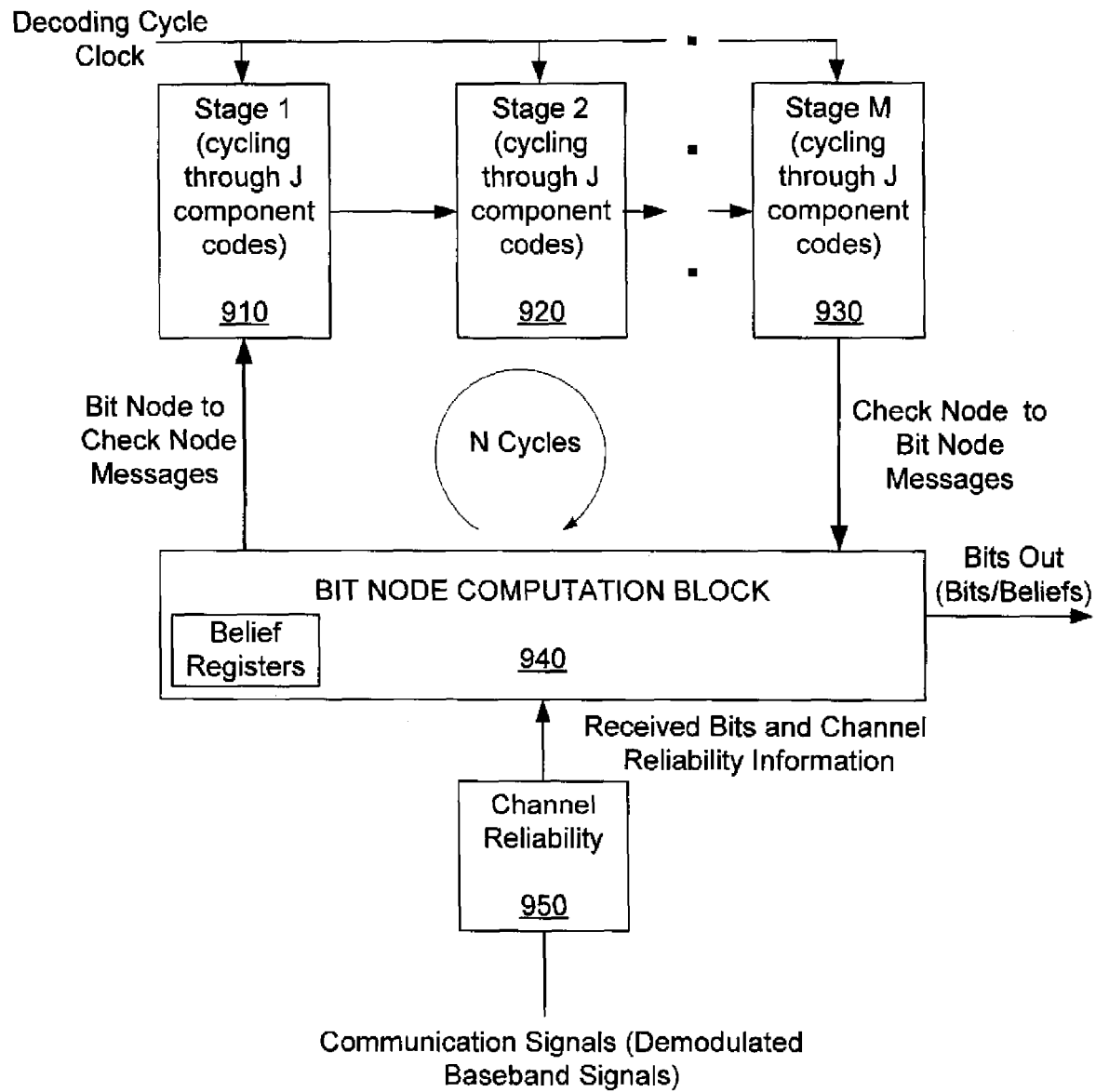
FIG. 9 shows greater detail of an example of an embodiment of a pipeline decoder.

FIG. 9 shows greater detail of an example of an embodiment of a pipeline decoder. This embodiment provides additional detail to the embodiment of FIG. 8. As shown, a channel reliability block 950 receives communication signals and generates bits and associated beliefs that represent the reliability of each of the bits. The channel reliability is computed based on the distance of the received signal from the demodulated point on a constellation according to techniques of digital communication systems. The belief values are created according to previously described methods.

A bit node computation block 940 receives the bits and channel reliabilities. Generally, the bit node computation block 940 updates beliefs of each bit based upon the channel reliability information and the check node to bit node messages received each decoding cycle. In addition, the bit node computation block 940 provides bit node to check node messages according, for example, an SPA algorithm. The bit node computation block 840 includes belief registers that are updated, for example, every decoding cycle (after the first M decoding cycles).

The bit node computation block 940 generates bit node messages that are received by M decoding stages 910, 920, 930. As previously described, the M stages of decoding cycle through all possible component codes (J component codes are indicated in FIG. 9). The M decoding stages perform successive component code processing on the bit node messages, generating check node messages.

The bit node computation block 940 generates bits out (bits and associated beliefs), for example, once every N iterations of the decoding based on the sign of the belief of each node. For example, if belief (b)>0, then b=0, and if belief (b)<0, then b=1. An iteration includes, for example, each stage 910, 920, 930 computing component codes using all of the possible J component codes.

The decoder shown in FIG. 9 does not require check node computations or bit node computations to sit idle. That is, the pipeline decoding allows each stages of decoding to be continually performing check node computations, each of the decoding stages performing a check node computation using a different one of J component codes. As previously stated, the one of the J component codes used by each decoding stage 910, 920, 930 changes with each decoding cycle, and each stage uses a different one of the J component codes for each decoding cycle.

FIG. 7 can be used for further understanding of the timing of the operation of each of the stages 910, 920, 930. That is, each decoding cycle of the decoding cycle clock includes each stage operating on a different component code (after the first M cycles). After one iteration, all of the stages have operated using all of the available component codes.

Figure 10:
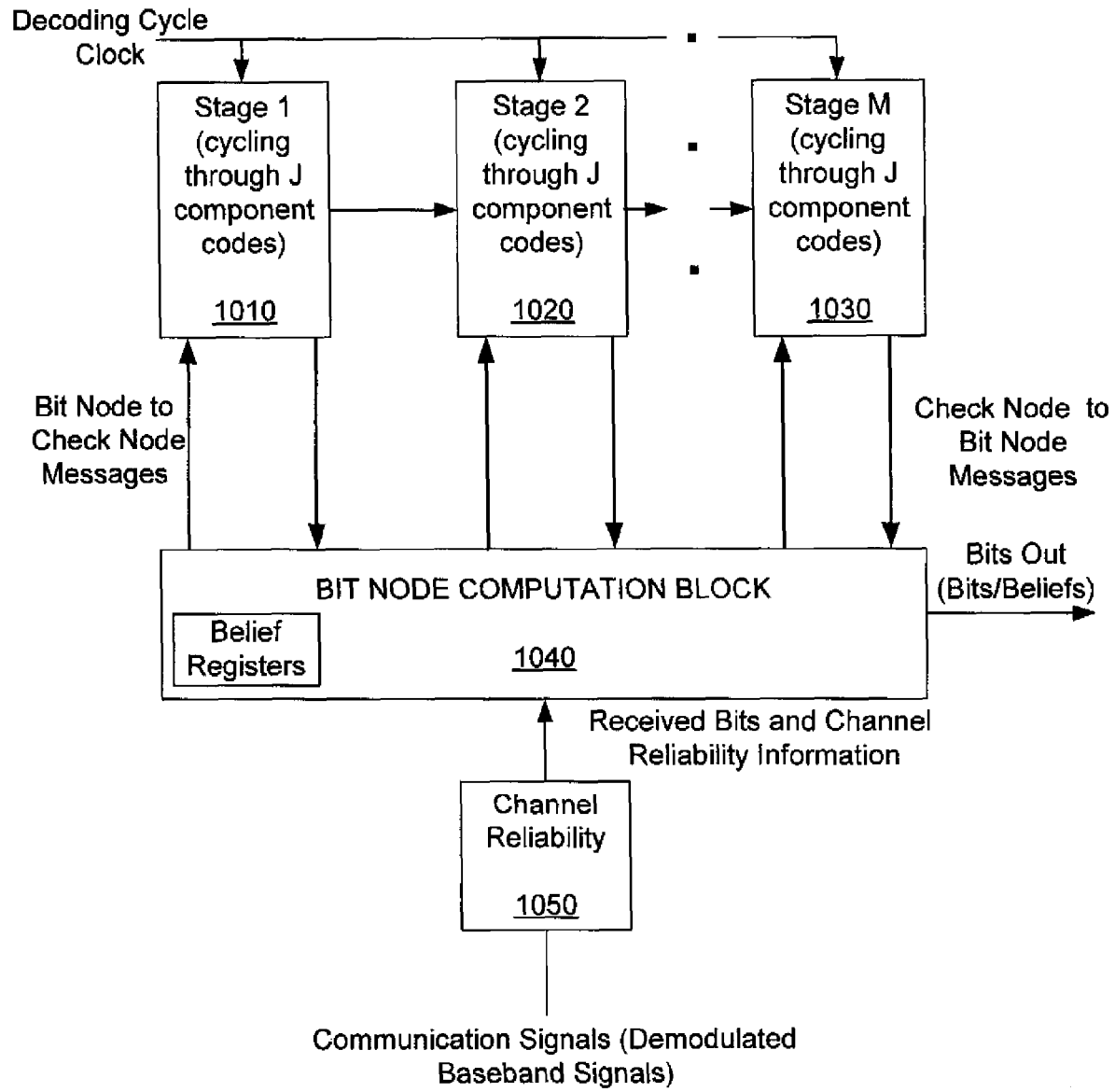
FIG. 10 shows greater detail of another example of an embodiment of a pipeline decoder.

FIG. 10 shows greater detail of another example of an embodiment of a pipeline decoder. This embodiment is arguably more general than the embodiment of FIG. 9. A channel reliability block 1050 receives communication signals and generates bits and associated beliefs. A bit node computation block 1040 generates bit node messages that are received by M decoding stages 1010, 1020, 1030. As shown, this embodiment includes each pipeline stage 1010, 1020, 1030 having access to all bit node to check node messages, and each pipeline stage 1010, 1020, 1030 generates check node to bit node messages for the bit node computation block.

Figure 11:
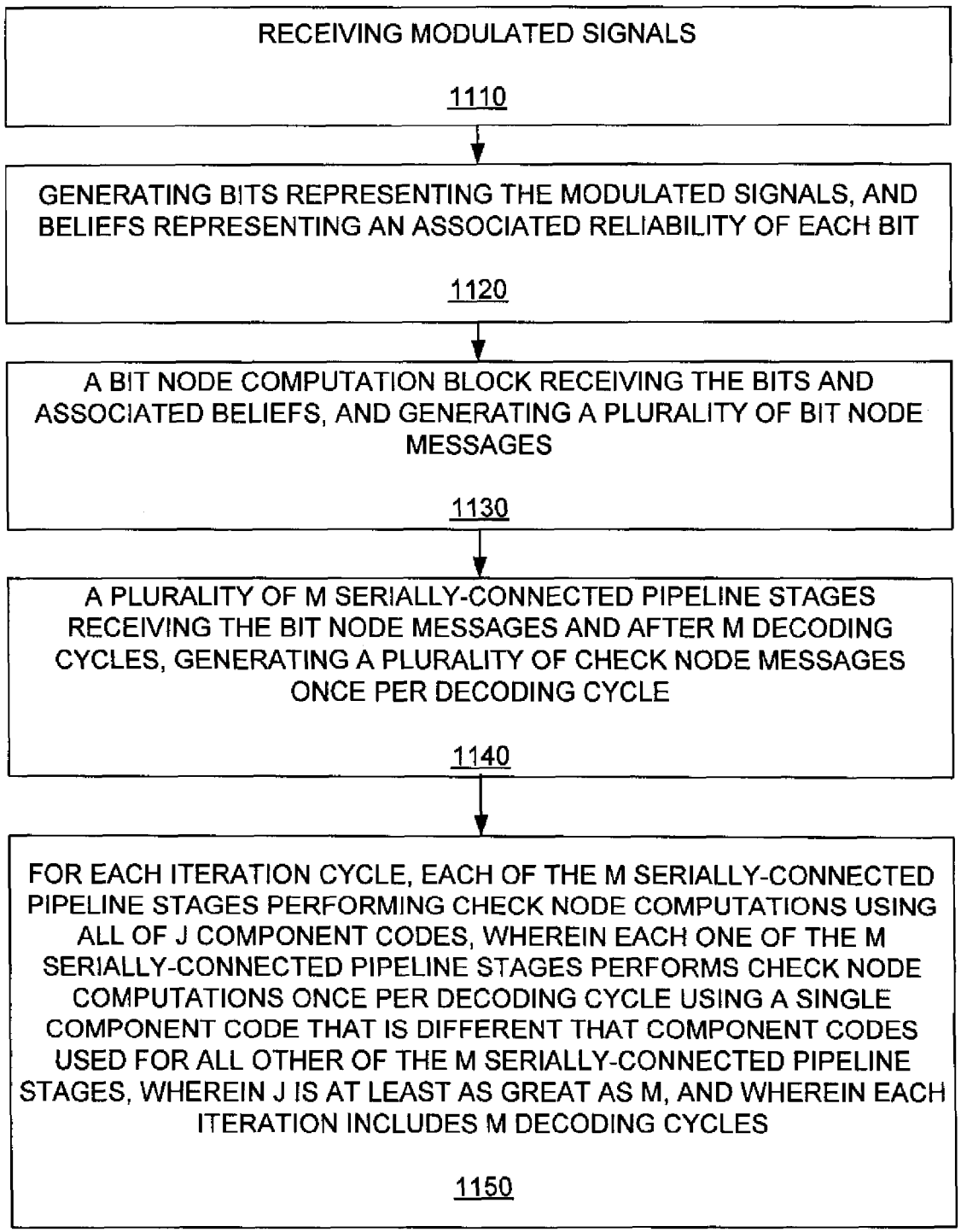
FIG. 11 is a flow chart showing an example of steps included in another embodiment of a method of pipeline decoding.

FIG. 11 is a flow chart showing an example of steps included in another embodiment of a method of pipeline decoding. The method decodes received signals, generating a received bit stream. A first step 1110 includes receiving modulated signals. A second step 1120 includes generating bits representing the modulated signals, and beliefs representing an associated reliability of each bit. A third step 1130 includes a bit node computation block receiving the bits and associated beliefs, and generating a plurality of bit node messages. A fourth step 1140 includes a plurality of M serially-connected pipeline stages receiving the bit node messages and after M decoding cycles, generating a plurality of check node messages once per decoding cycle. That is, it takes M decoding cycles for the messages to flow through the M serially-connected decoding stages before the check node messages are generated once per decoding cycle. A fifth step 1150 includes for each iteration cycle, each of the M serially-connected pipeline stages performing check node computations using all of J component codes, wherein each one of the M serially-connected pipeline stages performs check node computations once per decoding cycle using a single component code that is different that component codes used for all other of the M serially-connected pipeline stages, wherein J is at least as great as M, and wherein each iteration includes M decoding cycles.

An embodiment additionally includes every decoding cycle after M decoding cycles, the bit node computation block updating beliefs of the received bits using check node messages of a single one of the component codes per decoding cycle, wherein the single one component of the component codes changes for each decoding cycle according to a specific order of the component codes. The specific order can include a randomly selected order of the set of component codes. Additionally, an embodiment includes every decoding cycle, updating all bit node messages of the received bits using check node to bit node messages of a single one of the component codes per decoding cycle, wherein the single one component of the component codes changes for each decoding cycle according to a specific order of the component codes.

For an embodiment the bit node computation block generates a decoded received bit stream once for every N iterations, wherein N is a pre-selected number of iterations. For a specific embodiment, N is dynamically selected depending on whether all parity checks of the codes are satisfied. More specifically, once all parity checks have been matched, the decoding algorithm is terminated.

For an embodiment, the check node computations of each of the M serially-connected pipeline stages, includes different functionality than all other of the M serially connected pipeline stages. For a more specific embodiment, for each cycle of decoding, each of M−1 of the M serially-connected pipeline stage executes one step of check node computations and provides intermediate results to a next stage of the M serially-connected pipeline stages.

For an embodiment, for each iteration of decoding, each stage of the M serially-connected pipeline stages of decoding using updated bit node messages including all previous iterations.

For an embodiment, the column weights of a parity check matrix of the component codes are non-zero. An embodiment includes the parity check matrix including elements of ones and zeroes. A non-zero column weight means at least one of the elements of a column of the matrix is one. The column weight can be defined as the number of non-zero elements of the column.

An embodiment includes configuring a first of the M serially-connected pipeline stages with a specific component code, and configuring a last of the M serially-connected pipeline stages with another specific component code. A implementation of this embodiment includes a first sub-block of the first stage re-ordering bit node to check node messages, enabling processing of the a second sub-block of the first stage to remain static as the first stage cycles through processing using the J component codes. For an embodiment, the re-ordering of the bit node to check node messages changes every decoding cycle.

Additionally, an embodiment includes a second sub-block of the last (Mth) stage re-ordering check node to bit node messages, enabling processing of the a first sub-block of the last stage to remain static as the last stage cycles through processing using the J component codes. For an embodiment, the re-ordering of the check node to bit node messages changes every decoding cycle.

An embodiment includes a decoder. The decoder includes means for generating bits representing received signals, and beliefs representing a channel reliability of each bit. A bit node computation block receives the bits and associated beliefs, and generates a plurality of bit node messages and beliefs for each bit. Check node messages are initialized to zero at the beginning of the decoding. A plurality of M serially-connected pipeline stages receive the bit node messages and after M decoding cycles, generating a plurality of check node messages once per decoding cycle, wherein for each iteration cycle, each of the M serially-connected pipeline stages performs check node computations using all of J component codes, wherein each one of the M serially-connected pipeline stages performs check node computations once per decoding cycle using a single component code that is different that component codes used for all other of the M serially-connected pipeline stages, wherein J is at least as great as M, and wherein each iteration includes M decoding cycles.

Figure 12A:
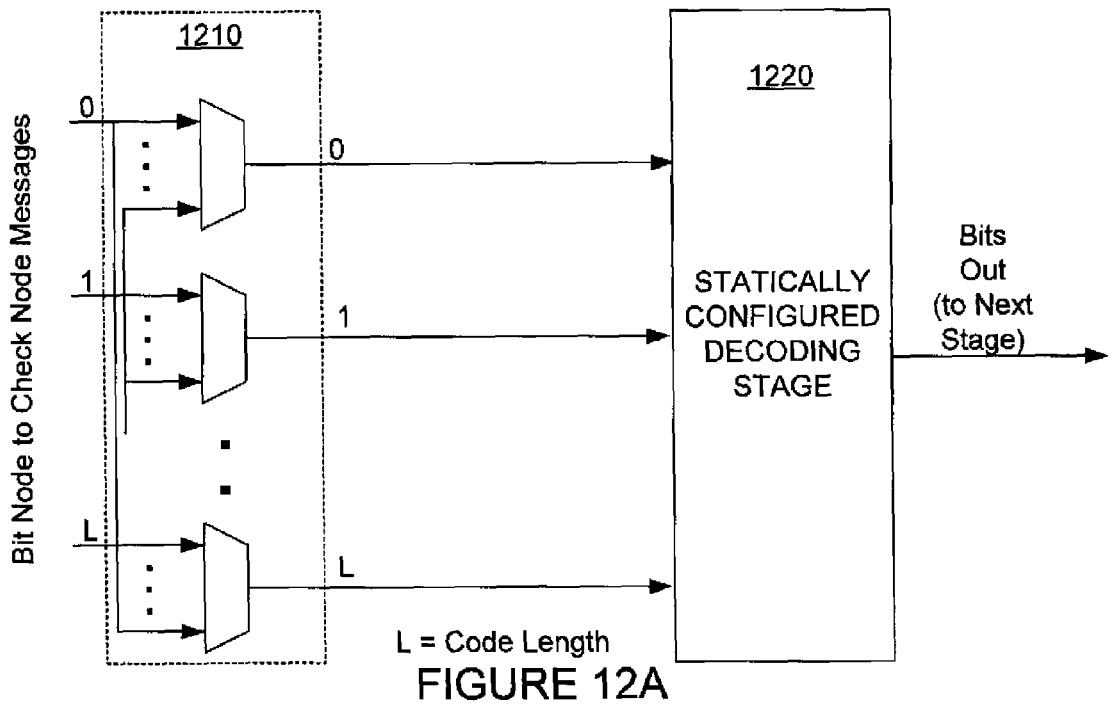
FIG. 12A shows an example of an embodiment of a first stage of a pipeline decoder that includes a first sub-block and a second sub-block.

FIG. 12A shows an example of an embodiment of a first stage of a pipeline decoder that includes a first sub-block 1210 and a second sub-block 1220 that functionally include the computations as outlined in the mathematical representations section. The first sub-block 1210 includes multiple multiplexers that receive and re-order that bit node to component messages. The second sub-block remains static as the first stage cycles through the component codes due to by re-ordering of the bit node to check node messages of the first sub-block every decoding cycle. For this embodiment, the number of multiplexers is equal to the length (L) of the code. For an embodiment, the number of inputs to each multiplexer is dependent upon the number of component codes because for each component code, a different configuration is required.

Figure 12B:
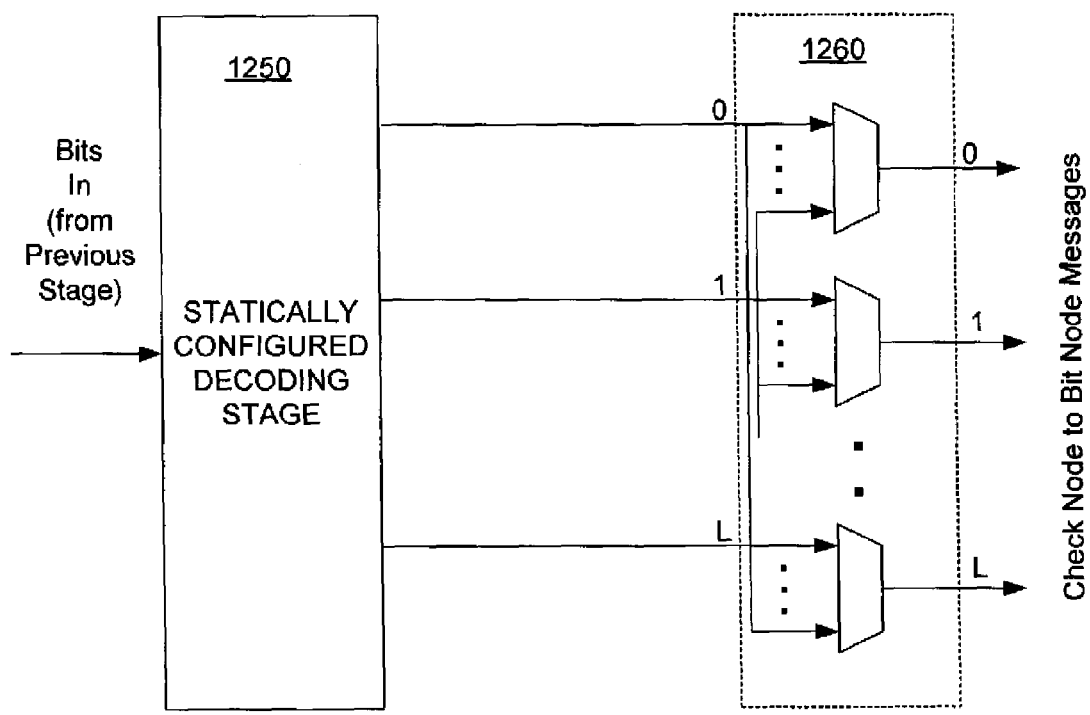
FIG. 12B shows an example of an embodiment of a last stage of a pipeline decoder that includes a first sub-block and a second sub-block.

FIG. 12B shows an example of an embodiment of a last stage of a pipeline decoder that includes a first sub-block 1250 and a second sub-block 1260 that functionally include the computations as outlined in the mathematical representations section. The second sub-block includes multiple multiplexers that re-order the check node to bit node messages every decoding cycle. The number of inputs to each multiplexer is dependent upon the number of component codes. The first sub-block 1250 includes static decoding circuitry while the last stage cycles through the component codes due to the second sub-block 1260 re-ordering the component node to bit node messages.

A Network of Devices

Figure 13:
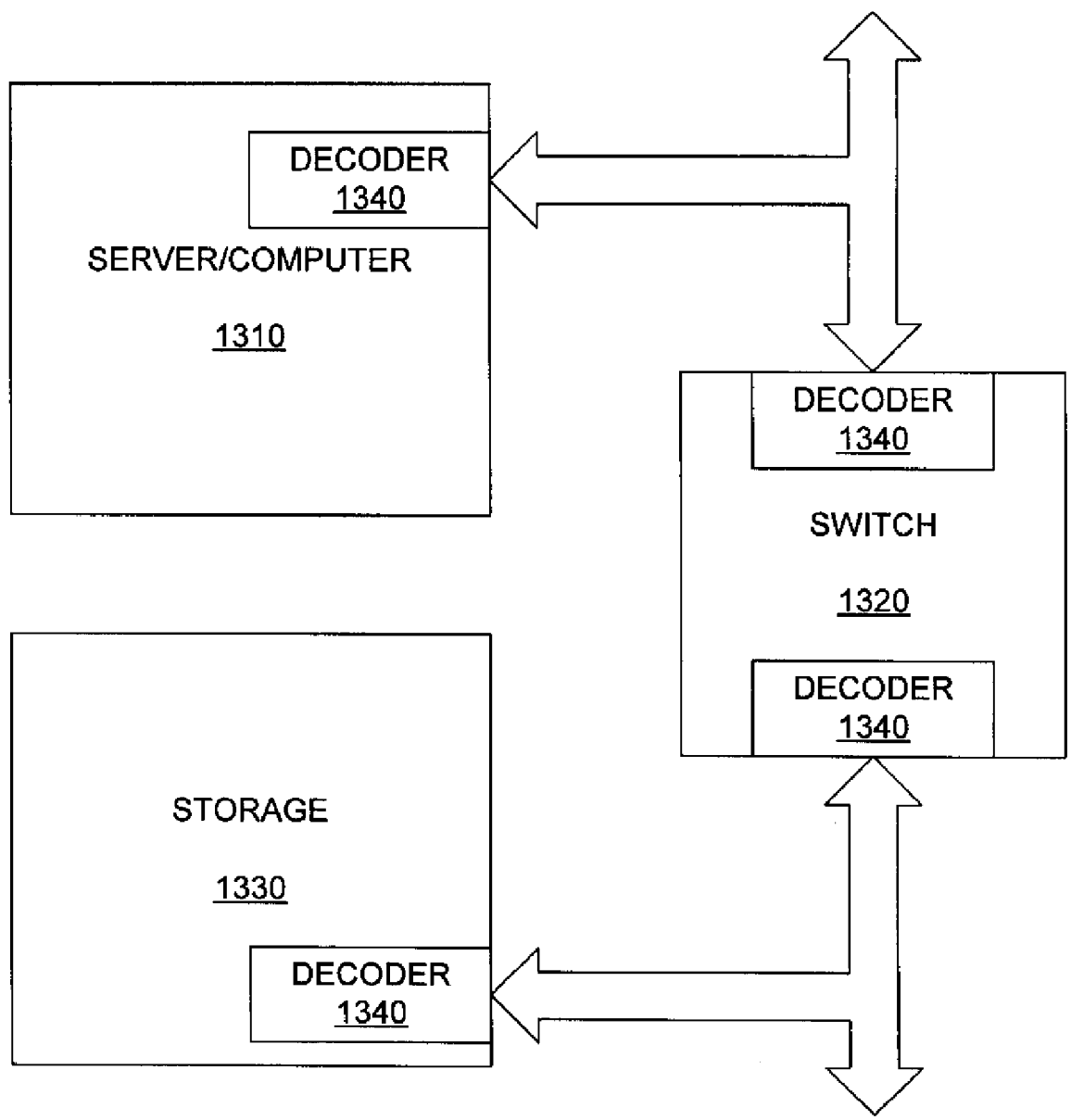
FIG. 13 shows devices connected to an Ethernet network that can include embodiments of the decoding.

FIG. 13 shows devices connected to an Ethernet network that can include embodiments of the decoding. The network includes a server/computer 1310, a switch 1320 and storage 1330 that can all benefit from the use of a low-power decoder 1340. The server/computer 1310 can be connected to the switch 1320 through an Ethernet twisted pair LAN connection. The switch 1320 can additionally be connected to the storage 1330 through an Ethernet twisted pair LAN connection. The low-power decoders 1340 within the server/computer 1310, the switch 1320, and the storage 1330 can provide minimization of ISI and FEXT interference of the Ethernet twisted pair LAN connections.

Although specific embodiments of the invention have been described and illustrated, the invention is not to be limited to the specific forms or arrangements of parts so described and illustrated. The invention is limited only by the appended claims.

What is claimed:

1. A decoder comprising:
   means for generating bits representing received signals, and beliefs representing a channel reliability of each bit;
   a bit node computation block receiving the bits, associated channel reliability and check node messages, and generating a plurality of bit node messages and beliefs for each bit;
   a plurality of M serially-connected pipeline stages for receiving the bit node messages and after M decoding cycles, generating a plurality of check node messages once per decoding cycle, wherein for each iteration cycle, each of the M serially-connected pipeline stages performs check node computations using all of J component codes, wherein each one of the M serially-connected pipeline stages performs check node computations once per decoding cycle using a single component code that is different than component codes used for all other of the M serially-connected pipeline stages, wherein J is at least as great as M, and wherein each iteration includes M decoding cycles.

2. The decoder of claim 1, wherein each of the M serially-connected pipeline stages are clocked by a decoding cycle clock.

3. The decoder of claim 1, further comprising:
   every decoding cycle after M decoding cycles, the bit node computation block updating beliefs of the received bits using check node messages of a single one of the component codes per decoding cycle, wherein the single one component of the component codes changes for each decoding cycle according to a specific order of the component codes.

4. The decoder of claim 1, further comprising:
   every decoding cycle, updating all bit node messages of the received bits using check node to bit node messages of a single one of the component codes per decoding cycle, wherein the single one component of the component codes changes for each decoding cycle according to a specific order of the component codes.

5. The decoder of claim 1, further comprising the bit node computation block generating a decoded received bit stream once every N iterations, wherein N is a pre-selected number of iterations.

6. The decoder of claim 5, wherein N is dynamically selected depending on whether all parity checks of the component codes are satisfied.

7. The decoder of claim 1, wherein the check node computations of each of the M serially-connected pipeline stages includes different functionality than all other of the M serially connected pipeline stages.

8. The decoder of claim 1, wherein for each cycle of decoding, each of M−1 of the M serially-connected pipeline stage executing one step of check node computations and providing intermediate results to a next stage of the M serially-connected pipeline stages.

9. The decoder of claim 1, wherein for each iteration, each stage of the M serially-connected pipeline stages of decoding using updated bit node messages including all previous iterations.

10. The decoder of claim 1, further comprising configuring a first of the M serially-connected pipeline stages with a specific component codes, and configuring a last of the M serially-connected pipeline stages with another specific component code.

11. The decoder of claim 10, further comprising:
a first sub-block of the first stage re-ordering bit node to check node messages, enabling processing of the a second sub-block of the first stage to remain static as the first stage cycles through processing using the J component codes.

12. The decoder of claim 11, wherein the re-ordering of the bit node to check node messages changes every decoding cycle.

13. The decoder of claim 1, wherein column weights of a parity check matrix of the component codes are non-zero.

14. The decoder of claim 1, wherein each component code comprises a regular LDPC, and column weights of a parity matrix of the component codes are pre-selected values.

15. The decoder of claim 14, wherein the pre-selected values are all the same.

16. The decoder of claim 15, wherein hardware implementing the stages includes a repeated structure.

17. The decoder of claim 1, wherein a parity check matrix of the component codes has column weights of one.

* * * * *